(12) United States Patent
Tsukamoto

(10) Patent No.: US 6,281,448 B1
(45) Date of Patent: Aug. 28, 2001

(54) PRINTED CIRCUIT BOARD AND ELECTRONIC COMPONENTS

(75) Inventor: Masahide Tsukamoto, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/371,603

(22) Filed: Aug. 10, 1999

Related U.S. Application Data

(62) Division of application No. 08/997,624, filed on Dec. 23, 1997.

(30) Foreign Application Priority Data

| Dec. 26, 1996 | (JP) | 8-347282 |
| Apr. 30, 1997 | (JP) | 9-113174 |

(51) Int. Cl.[7] .................................................. H05K 1/16
(52) U.S. Cl. ................... 174/260; 174/261; 174/262; 174/265; 361/760
(58) Field of Search ........................ 174/250, 255, 174/261, 262, 263, 264, 266, 265; 361/760, 767

(56) References Cited

U.S. PATENT DOCUMENTS

| 2,864,156 | * | 12/1958 | Cardy | 174/265 X |
| 3,411,204 | * | 11/1968 | Reid | 174/266 X |
| 4,493,789 | * | 1/1985 | Ueyama et al. | 252/514 |
| 4,604,496 | | 8/1986 | Ishihara et al. | 174/264 |
| 5,290,732 | * | 3/1994 | Kumar et al. | 216/13 |
| 5,473,120 | | 12/1995 | Ito et al. | 174/264 |
| 5,473,194 | | 12/1995 | Kawai et al. | 257/774 |
| 5,543,585 | | 8/1996 | Booth et al. | 174/261 |
| 5,699,613 | * | 12/1997 | Chong et al. | 174/264 |

FOREIGN PATENT DOCUMENTS

| 0 475 022 A1 | 3/1992 | (EP) . |
| 0 567 306 A2 | 10/1993 | (EP) . |
| 0 704 899 A2 | 4/1996 | (EP) . |
| 2-137295 | * 5/1990 | (JP) . |
| 4-93096 | * 3/1992 | (JP) . |
| 5-275819 | 10/1993 | (JP) . |
| 6-21619 | 1/1994 | (JP) . |
| 8-32239 | 2/1996 | (JP) . |
| 8-169776 | * 7/1996 | (JP) . |
| 4-88079 | 7/1999 | (JP) . |

OTHER PUBLICATIONS

Patent Abstracts of Japan, 13:371 (Aug. 17, 1989), Abstract of Publ. No. 01 124296, Publ. Date : Jul. 17, 1989.
Patent Abstracs of Japan, 1996:9 (Sep. 30, 1996), Abstract of Publ. No. 08 139450, Publ. Date : May 31, 1996.
Patent Abstracts of Japan, 13:513 (Nov. 16, 1989), Abstract of Publ. No. 01 207938, Publ. Date : Aug. 21, 1989.
Patent Abstracts of Japan, 12:167 (May 19, 1998), Abstract of Publ. No. 62 277754 Publ. Date : Dec. 2, 1987.
Susumu Honda, "Present and Future of Technologies for Build–Up Type Multilayer Boards," Magazine of Japan Institute for Inteconnecting and Packaging Electronics Circuits, vol. 11, No. 7, pp. 462–468, 1996.
M. Okano, et al., "Any Layer IVH Structure Multilayer Printed Wiring Board," presented at 1995 Microelectronics Symposium, pp. 163–164, 1995.
K. Takenouchi, et al., "Development of Polyimide Multilayer Circuit Board," presented at the Tenth Lecture Meeting on Interconnecting and Packaging Electronic Circuits, pp. 81–82, 1996.

* cited by examiner

Primary Examiner—Albert W. Paladini
(74) Attorney, Agent, or Firm—Smith, Gambrell & Russell, LLP

(57) ABSTRACT

A printed circuit board has: a base material layer having a first via hole; and an insulating layer having a second via hole, the insulating layer being provided on one surface of the base material layer, wherein a cross-sectional area of the second via hole is smaller than a cross-sectional area of said first via hole, and wherein the first and second via holes are filled with a conductive material.

22 Claims, 14 Drawing Sheets

FIG. 8(A) PRESSURIZING & HEATING
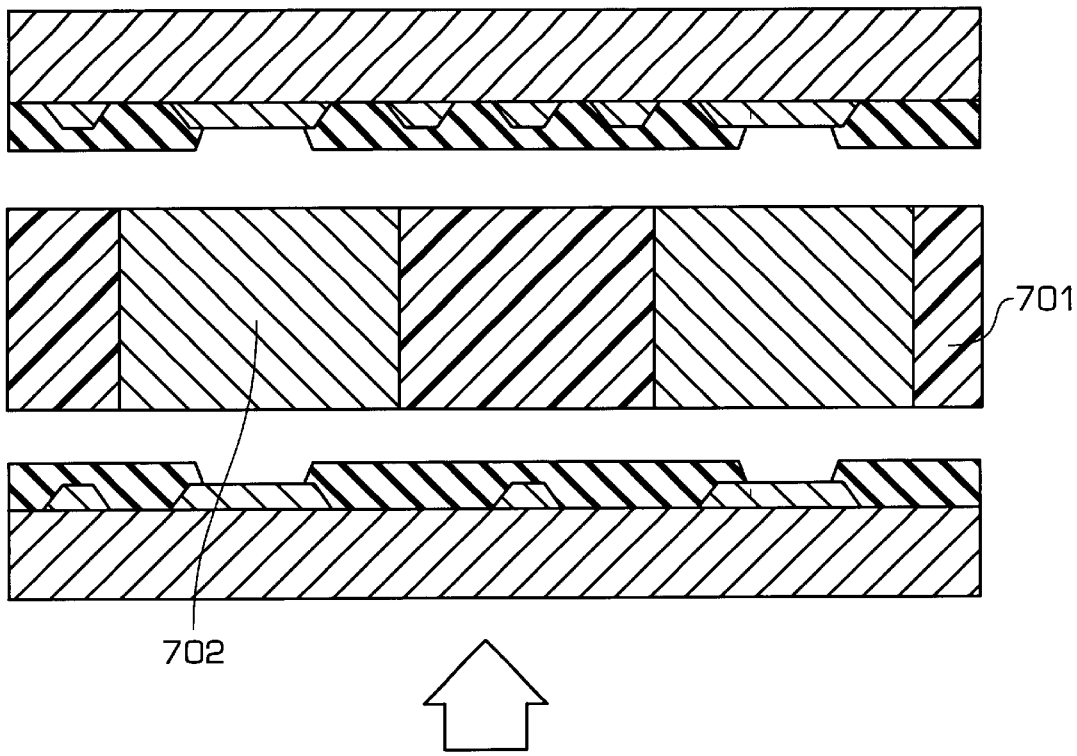
FIG. 8(B)
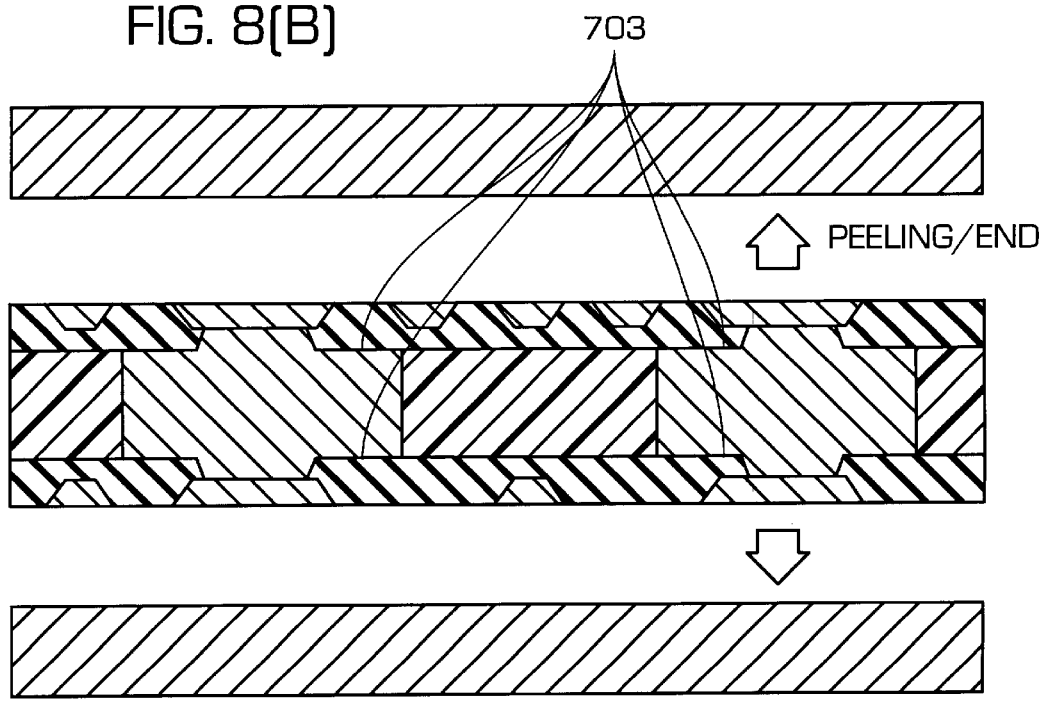
PEELING/END 1202  1201

1203  1204  1203

1205

PRESSURIZING & HEATING

1501

1501

1502

PRINTED CIRCUIT BOARD AND ELECTRONIC COMPONENTS

This application is a divisional of U.S. patent application Ser. No. 08/997,624, filed on Dec. 23, 1997, which application is incorporated entirely herein by reference.

BACKGROUND OF THE INVENTION

1. Field of the Invention

The present invention relates to a printed circuit board of two or more layers, and electronic components.

2. Background of the Invention

In recent years, as electronic apparatuses have become smaller and denser, multilayer printed circuit boards being inexpensive and in which semiconductor chips such as LSIs may be mounted at a high density have been strongly demanded not only in the field of industrial apparatuses but also in the field of consumer apparatuses. In such multilayer printed circuit boards, it is important that fine-pitch interconnecting patterns on the layers are electrically connected between the layers with a high degree of reliability.

With respect to this demand, it is extremely difficult to satisfy it by use of conventional printed circuit board manufacturing methods using drilling, etching of copper-coated laminations or plating, so that printed circuit boards having new structures are being developed.

Current representative examples of high-density printed circuit boards include the following:

The first example is a method called a built-up process in which a conventional double-sided or multilayer printed circuit board is used as the core board and insulating layers having smaller via holes and wiring layers being finer are laminated thereon (Susumu Honda "Current State and Problems of Built-up Multilayer Printed Circuit Board Technology", Magazine of Japan Institute for Interconnecting and Packaging Electronic Circuits, Vol. 11, No. 7, pp.462–468 (1996)). According to this method, small holes for smaller via holes are formed in the insulating layers by photoetching or chemical etching by use of a photosensitive insulating material or a chemically etchable material. Recently, methods have been developed which use plasma or a laser to form the holes in the insulating layers. When a laser is used, it is unnecessary for the material to have photosensitivity or chemically etchable property, so that the insulative material may be selected from a wider range.

The second example is a stacking process in which copper foils are laminated on a prepreg with holes filled with a conductive paste (Hiroyuki Okano, "Resin Multilayer Circuit Board with All Layers Having IVH Structure", 1995 Microelectronics Symposium, p.163 (1995)) (generally, this type of circuit board is frequently classified as a built-up multilayer printed circuit board). Researches have been carried out on a circuit board using instead of a prepreg a film having an adhesive (Keiichi Takenouchi et al. "Development of Polyimide Multilayer Circuit Board", Papers Presented at the Tenth Lecture Meeting on Interconnecting and Packaging Electronic Circuits, pp.81–82 (1996)).

The third example is a method using a thin film multilayer and is similar to the built-up process described as the first example. This is a thin film multilayer circuit board in which a conventional ceramic multilayer circuit board is used as the core board and on surfaces thereof, inorganic or organic insulating layers and conductive wiring layers patterned by plating and photoetching, etc. are laminated. At present, this method, which uses thin film technology, is the method by which the densest printed circuit boards are manufactured. For the insulating layers, photosensitive polyimide is most frequently used.

However, these printed circuit board manufacturing methods have defects.

According to the built-up process, it is difficult to obtain denser printed circuit boards because a conventional low-density glass epoxy multilayer circuit board is used as the core of the inner layer. In addition, in order to obtain denser printed circuit boards, it is necessary to increase the number of insulating and wiring layers being built up, so that it is technically difficult to flatten the surfaces of printed circuit boards, or the cost increases.

According to the stacking process, it is difficult to form at a low cost the small holes in a prepreg or a film (base material) of a thickness for higher density.

According to the thin film multilayer method which uses a thin film process, the cost is high.

SUMMARY OF THE INVENTION

In view of these problems of the conventional multilayer printed circuit board manufacturing methods, it is an object of the present invention to provide a printed circuit board manufacturing method in which high-density printed circuit boards are easily manufactured at a low cost and a core board having a maximum work size may be used.

To achieve the above-mentioned object, a printed circuit board according to the present invention comprises a base material layer having a first via hole and an insulating layer having a second via hole, said insulating layer being provided on at least one surface of said base material layer, wherein a cross-sectional area of said second via hole is smaller than a cross-sectional area of said first via hole, and wherein said first and second via holes are filled with a conductive material. With these features, fine wiring and fine via hole connection in a printed circuit board having a large work size are enabled, so that low-cost printed circuit boards and electronic components are obtained.

A printed circuit board of the present invention comprises: a base material layer having a first via hole; and an insulating layer having a second via hole, said insulating layer being provided on at least one surface of said base material layer, wherein a cross-sectional area of said second via hole is smaller than a cross-sectional area of said first via hole, and wherein said first and second via holes are filled with a conductive material.

In the printed circuit board of the present invention, said conductive material is a conductive paste.

In the printed circuit board of the present invention, said conductive material with which said first via hole is filled and said conductive material with which said second via hole is filled are the same.

In the printed circuit board of the present invention, said conductive material with which said first via hole is filled and said conductive material with which said second via hole is filled are different.

In the printed circuit board of the present invention, said insulating layer is provided on both surfaces of said base material layer.

In the printed circuit board of the present invention, a wiring portion is provided outside said insulating layer.

In the printed circuit board of the present invention, a wiring portion is provided inside said insulating layer.

In the printed circuit board of the present invention, insulating layer comprises a plurality of layers.

In the multilayer printed circuit board of the present invention, a plurality of said printed circuit boards can be laminated.

In a circuit component mount unit of the present, a circuit component is mounted and connected to said wiring portion on an outermost layer of said printed circuit board or to said wiring portion on an outermost layer of said multilayer printed circuit board.

In a circuit component mount unit of the present invention, said circuit component includes a bare integrated circuit.

An electronic component package of the present invention comprises: a base material layer having a first via hole, said base material having a copper foil pad attached to one surface; an insulating layer having a second via hole, said insulating layer being provided on another surface of said base material; and an electronic component having an electrode so as to correspond to a position of said second via hole, wherein a cross-sectional area of said second via hole is smaller than a cross-sectional area of said first via hole, and wherein said first and second via holes are filled with a conductive material.

In an electronic component package of the present invention, said conductive material is a copper paste.

In an electronic component package of the present invention, said conductive paste includes an abrasive.

In an electronic component package of the present invention, said copper foil pad can be omitted, and said conductive material with which the first and second via holes are filled is solderable.

In an electronic component package of the present invention, said insulating layer and said conductive material have flexibility.

In an electronic component package of the present invention, said electrode of said electronic component is an aluminum electrode.

A printed circuit board manufacturing method of the present invention comprises;
  a first step of forming a wiring layer on an insulating layer having a second via hole; and
  a second step of transferring said insulating layer and said wiring layer onto a base material layer having a first via hole filled with a conductive material, said first via hole having a larger cross-sectional area than said second via hole.

In a printed circuit board manufacturing method of the present invention, in said first step, said second via hole is filled with a conductive paste.

A printed circuit board manufacturing method of the present invention comprises a step of laminating an insulating layer on a base material layer and forming a wiring layer on said insulating layer, said base material layer having a first via hole filled with a conductive material, said insulating layer having a second via hole having a smaller cross-sectional area than said first via hole.

An electronic component package manufacturing method of the present invention comprises the steps of:
  forming an insulative resin layer on a surface of an electronic component having a predetermined electrode on said surface;
  forming a through hole in said insulative resin layer so as to correspond to a position of said electrode;
  embedding a conductive paste into said through hole; and
  heating and pressurizing said insulative resin layer filled with said conductive paste to thereby paste said insulative resin layer to said electronic component.

In an electronic component package manufacturing method of the present invention, conductive paste is a copper paste.

In an electronic component package manufacturing method of the present invention, said conductive paste includes an abrasive.

In an electronic component package manufacturing method of the present invention, said insulative layer has a compressibility.

In an electronic component package manufacturing method of the present invention, said insulative layer is a prepreg with aramid nonwoven cloth as a reinforcing material.

BRIEF DESCRIPTION OF THE DRAWINGS

FIG. 8 shows an example of a transfer process according to an embodiment of the present invention;

DESCRIPTION OF THE PREFERRED EMBODIMENTS

Embodiments of the present invention will hereinafter be described with reference to the drawings.

First Embodiment

Figure 1:
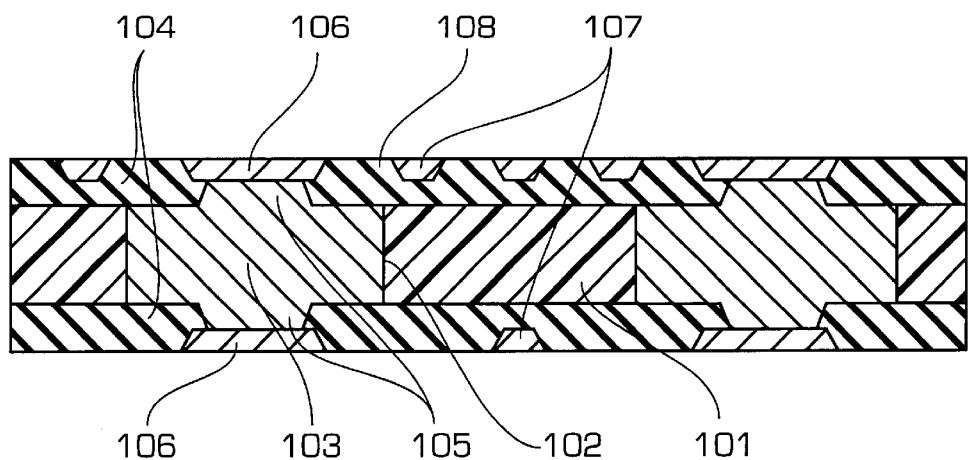
FIG. 1 is a cross-sectional view of a double-sided printed circuit board according to an embodiment of the present invention.

FIG. 1 is a cross-sectional view of a double-sided printed circuit board according to a first embodiment of the present invention. A base material layer 101 with a first via hole 103 is provided and an insulating layer 104 with a second via hole 105 having a smaller cross-sectional area than the first via hole is provided on each surface of the base material layer 101. Above the via hole 105, a via pad 106 is provided. Reference numeral 107 represents a wiring. The wiring and the via pad constitute a wiring layer. The upper and lower wiring layers 107 are electrically connected by the first via hole 103 and the second via hole 105 and constitute a double-sided printed circuit board as a whole.

Since the circuit board has such a structure, the cross-sectional area of the second via hole 105 may be small. Moreover, although the wiring 107 is formed on the insulating layer 104, since the second via hole 105 is small in size, the via pad 106 thereof may be small, so that even if the first via hole 103 has a large cross-sectional area, a fine (high-density) printed circuit board is obtained irrespective of the cross-sectional area of the first via hole 103. Consequently, short circuit with the first and second via holes 103 and 105 does not occur even if a wiring interval 108 is small. In addition, since the cross-sectional area of the first via hole 103 may be large as mentioned above, manufacture of printed circuit boards is facilitated.

It is preferred for the base material layer 101 to be electrically insulative and have a mechanical strength necessary as a circuit board. A glass epoxy board comprising hardened epoxy resin with glass fibers as a reinforcing material or an aramid epoxy board comprising hardened epoxy resin with aramid fibers as a reinforcing material may be used. Known resins may be used which have been developed for printed circuit boards.

A via hole 102 comprising the first via hole 103 and the second via hole 105 is filled with a conductive material. As the conductive material, a hardened conductive paste in which copper powder or silver power is mixed in resin, or gold, silver, copper, lead, etc. or an alloy thereof may be used.

The conductive material with which the first via hole 103 is filled and that with which the second via hole 105 is filled may be the same or may be different. Different materials are preferable for filling the via holes having different diameters to each other.

Figure 2:
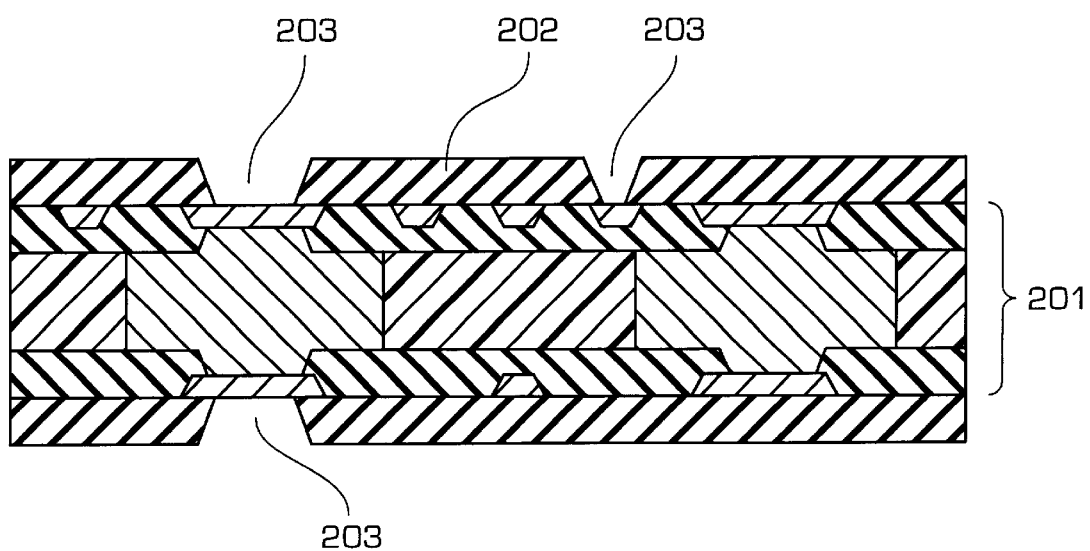
FIG. 2 is a cross-sectional view of a double-sided printed circuit board in which wiring layers are provided inside insulating layers in the embodiment of the present invention.

While the wiring layers 107 are formed outside the insulating layers 104 in FIG. 1, as shown in FIG. 2, insulating layers 202 may be provided outside a double-sided circuit board 201 of FIG. 1 so that the wiring layers 107 are situated inside the overall insulating layer (comprising the insulating layers 104 and the insulating layers 202). The structure shown in FIG. 2 is effective when multilayer printed circuit boards are manufactured. Holes 203 formed in the surfaces serve as via holes for connection to upper and lower layers. The cross-sectional area of the hole 203 may be freely decided. When insulating layers are used as the surface layers, the insulating layers 202 are solder resist layers. Methods for manufacturing the printed circuit boards of the structures of FIGS. 1 and 2 will be described later.

Figure 3:
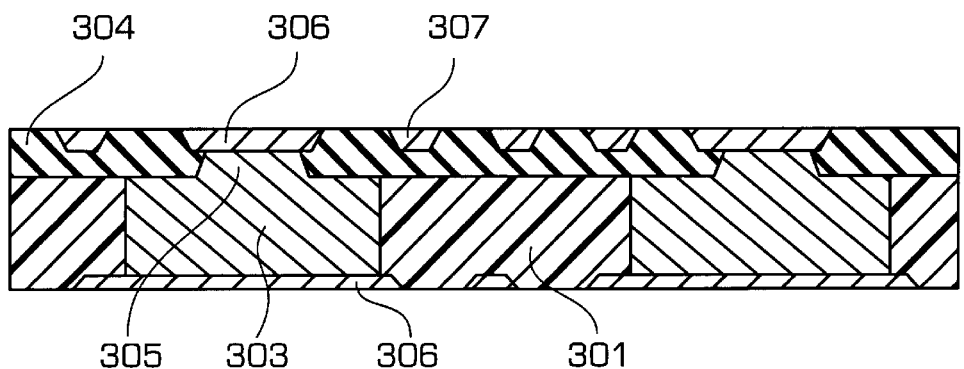
FIG. 3 shows an embodiment in which the insulating layer is provided only on one surface of a base material in the embodiment of the present invention.

FIG. 3 shows an embodiment in which an insulating layer 304 is provided only on one surface of a base material layer 301. Reference numeral 303 represents a first via hole. Reference numeral 305 represents a second via hole having a small cross-sectional area. Via pads 306 and wirings 307 constitute wiring layers. Since the insulating layer 304 prevents the wirings 307 from short-circuiting with the first via hole 303 having a large cross-sectional area, fine wiring is enabled.

The provision of the insulating layers like in the above-described examples not only enables fine wiring but also is effective for ensuring the adhesive strength of the wirings 307.

Figure 4:
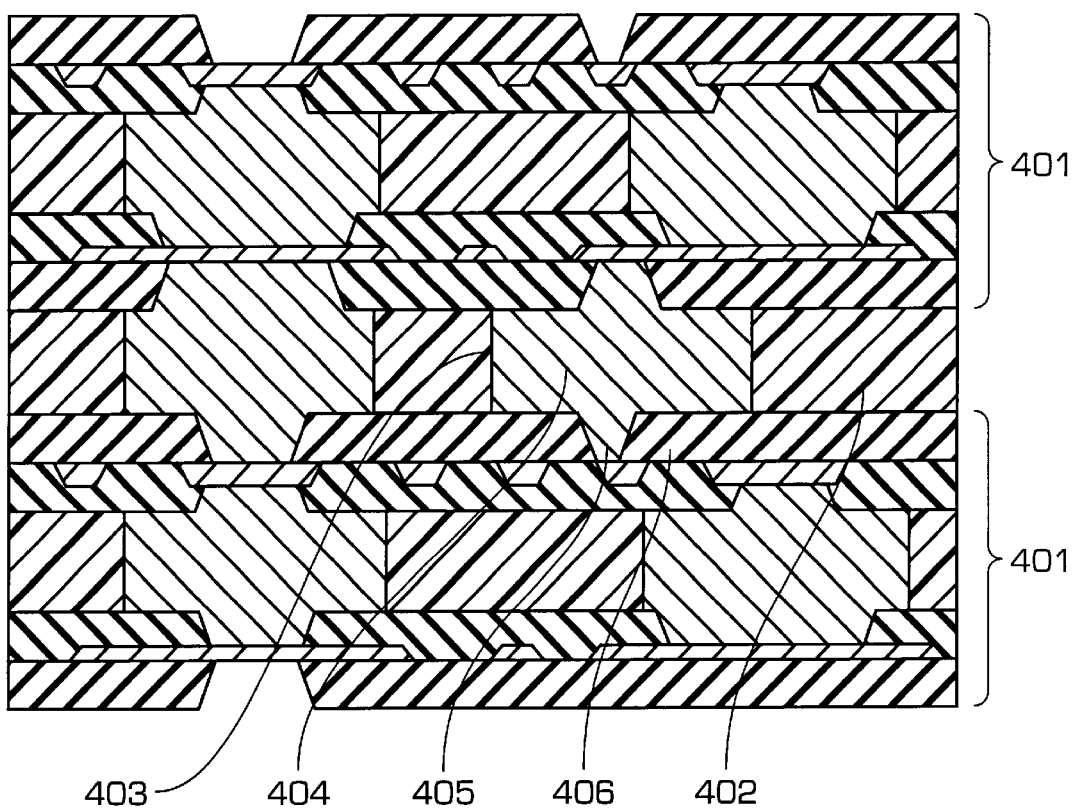
FIG. 4 is a cross-sectional view of a multilayer printed circuit board (four-layer printed circuit board) according to an embodiment of the present invention.

FIG. 4 shows a cross-sectional view of a multilayer printed circuit board (four-layer printed circuit board) according to the present invention. Two double-sided printed circuit boards 401 are the same as the one described with reference to FIG. 2. The two double-sided printed circuit boards 401 are mechanically and electrically connected through a base material 402 having a via hole 403. The via hole 403 comprises a first via hole 404 provided in the base material 402 and a via hole 405 provided in an insulating layer 406 and having a smaller cross-sectional area than the first via hole 404. As the materials for the base material and the via holes, the same ones as those described with reference to FIG. 1 may be used.

Figure 6:
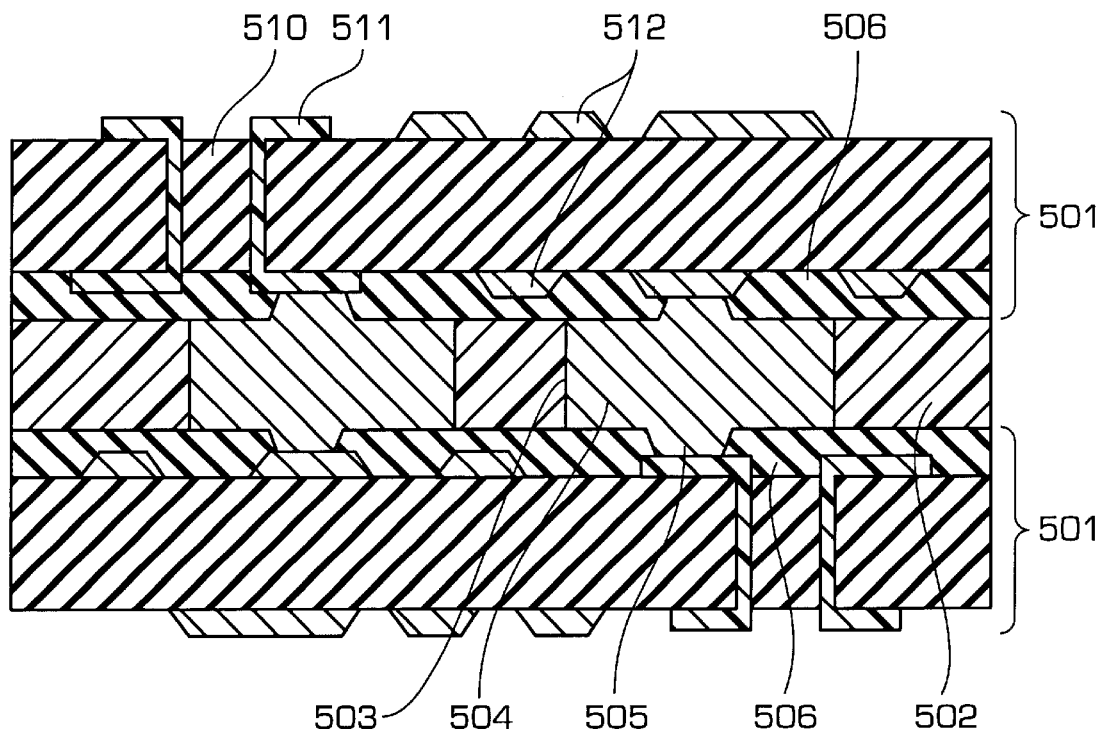
FIG. 6 shows another embodiment of the multilayer printed circuit board of the present invention.

As the upper and lower double-sided printed circuit boards 401, it is not always necessary to use double-sided printed circuit boards of a structure according to the present invention. As an example, FIG. 6 shows a cross-sectional view of a four-layer printed circuit board in which a printed circuit board structure according to this embodiment is applied to two conventional double-sided printed circuit boards. Reference numeral 501 represents conventional via hole glass epoxy double-sided printed circuit boards. Wirings 512 on both surfaces are electrically connected by a via hole 511. While an inside 510 of the via hole is typically empty, the via hole 511 is filled with resin in this example. Two conventional double-sided circuit boards 501 are mechanically and electrically connected through a base material 502 having a via hole 503. The via hole 503 comprises a first via hole 504 provided in the base material 502 and a via hole 505 provided in an insulating layer 506 and having a smaller cross-sectional area than the first via hole 504. As the materials for the base material and the via holes, the same ones as those described with reference to FIG. 1 may be used.

While four-layer printed circuit boards were described with reference to FIGS. 4 and 6, it is to be understood that the present invention is not limited thereto. More layers may be laminated in a similar structure.

Methods for manufacturing the printed circuit boards according to the above-described embodiments of the present invention will be described.

Figure 7:
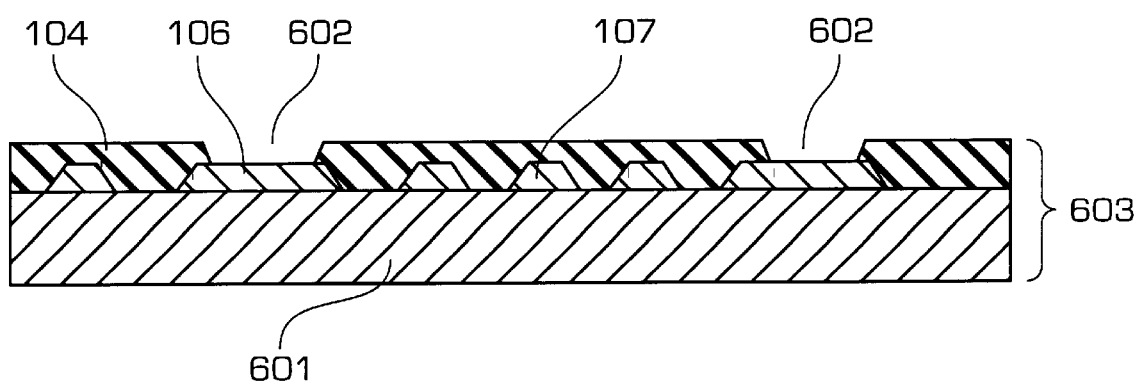
FIG. 7 shows an example of a transfer medium according to an embodiment of the present invention.

First, a manufacturing method using transfer technology will be described. This method uses a transfer medium as shown in FIG. 7. On a surface of a supporter 601 with the surface processed so as to be peelable, a wiring layer is formed such as the wiring 107 including the via pad 106. The formation is performed through a wiring forming process using plating, evaporation and photoprocess. On the wiring layer, the insulating layer 104 is formed having a hole 602 which is to serve as the second via hole. A transfer medium 603 thus structured is prepared. Specifically, a copper pattern formed by plating is formed on a supporter made of stainless steel.

Two of such transfer media are prepared and an unhardened base material 701 having a hole which is to serve as the first via hole and is filled with a conductive paste 702 is sandwiched between the transfer media as shown in FIG. 8. Then, the lamination is pressurized and heated in a vacuum (FIG. 8A) to harden the conductive paste and the base material for integration. Then, the supporters are peeled off (FIG. 8B) As the unhardened base material 701, for example, an aramid epoxy prepreg may be used which is aramid nonwoven cloth pregnant with epoxy resin. As the conductive paste, copper paste may be used. The holes may be formed by a laser or may be mechanically formed by a drill. With respect to the size of the holes, when the unhardened base material is approximately 150 μm in thickness, holes of approximately 100 μm to 300 μm are easy to form. The aramid epoxy prepreg which has a multiplicity of cavities inside is compressed when pressurized and heated, so that the base material decreases in thickness as shown in FIG. 8B. At this time, the copper paste and the first via hole constitute the second via hole. In actuality, there are occasions when the copper paste is squeezed out at portions 703 of FIG. 8. The conductive paste 702 may be provided so as to protrude from the surface of the prepreg.

Another method is such that a cone-shaped protrusion comprising hardened conductive paste is formed on the lower-side second via hole and the protrusion conductor is connected with the upper-side second via hole penetrating through a base material made of softened resin.

While an aramid epoxy prepreg is used as the unhardened base material in the above-described example, the present invention is not limited thereto. For example, a sheet comprising an insulative film coated with an adhesive may be used, or a sheet-form unhardened adhesive may be used. The conductive paste is not limited to copper paste. For example, conductive paste of gold, silver or carbon, etc. may be used.

Moreover, it is unnecessary that the first via hole be filled with only the conductive paste. For example, a metallic ball may be embedded in the hole so that the electric connection is made by the conductive paste with which the second via hole is filled.

When the wiring 107 and the via pad 106 of FIG. 7 are necessarily fine, they may be formed by the additive process. That is, a patterned plating resist layer is formed on a surface of the supporter 601 before plating, and a plating film is deposited on the exposed portion of the conductive supporter. According to this method, a pattern is obtained which is fine and has a large film thickness. The wiring and the via pad may be formed by printing conductive paste. This is a very easy method. In the case where pressurizing and heating are performed at the time of the transfer, the conductivity is higher than in the case where hardening is performed only by heating.

Figure 9:
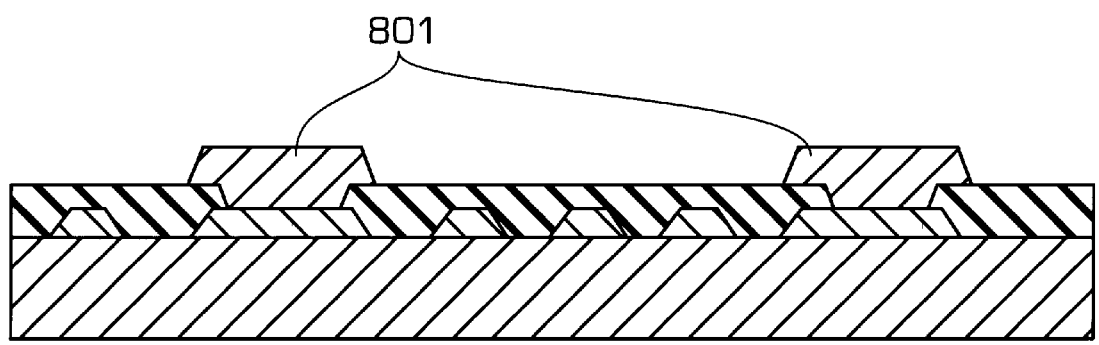
FIG. 9 shows an example of a transfer medium according to an embodiment of the present invention.
Figure 10:
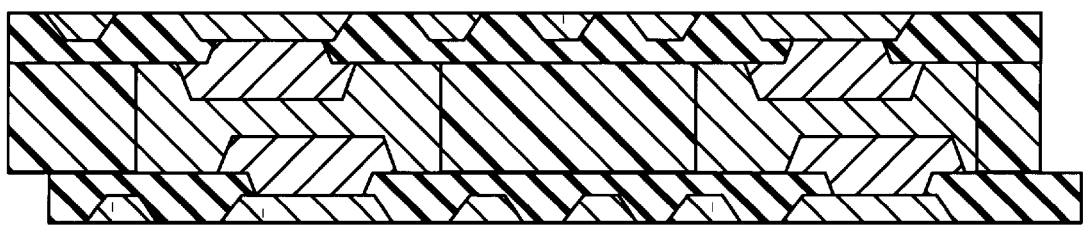
FIG. 10 is a cross-sectional view of a double-sided printed circuit board manufactured by using the transfer medium of FIG. 9.

By using a transfer medium as shown in FIG. 9, the electrical connection between the first via hole and the second via hole is ensured. Reference numeral 801 represents a conductive paste with which the second via hole is filled. The conductive paste 801 may be formed by printing. Needless to say, it may be formed by use of plating and patterning technology. In the case of using the transfer medium as FIG. 9, the difficulty of flowing of the conductive paste into the small second via hole is more eliminated in comparison with the transfer medium of FIG. 7. FIG. 10 is a cross-sectional view of a double-sided printed circuit board manufactured by using the transfer medium of FIG. 9. While the conductive material of the first via hole and that of the second via hole are different in this circuit board, it is needless to say that they may be the same. In FIG. 10, the upper and lower patterns on the double-sided printed circuit board are shifted from each other in position. This indicates that the position alignment of the upper and lower patterns may be rough in this embodiment. That is, since a big first via hole may be formed in this embodiment, the condition of the connection is excellent even if the patterns are somewhat shifted from each other in position. Since the patterns may be somewhat shifted from each other in position, it is enabled to form a circuit board having a large work size and obtain products by dividing it in the last place (while via holes tend to shift from each other in position in a circuit board having a large work size, a sufficiently large work size may be provided in a circuit board in which the connection is ensured even if the via holes are somewhat shifted from each other in position like in this embodiment). Thus, the present invention produces an advantage that a circuit board may be manufactured in which the work size is large although the patterns and the via holes are fine.

Figure 11:
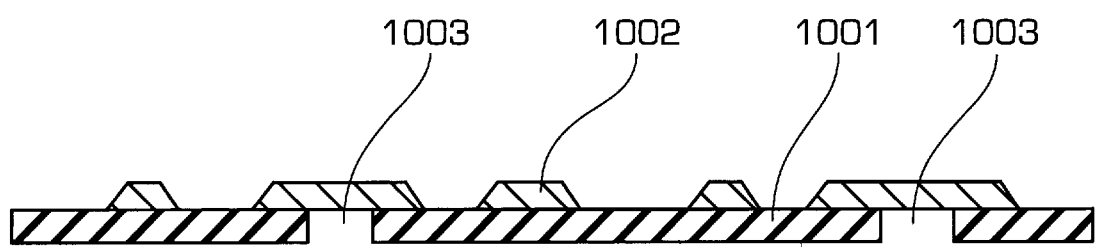
FIG. 11 shows a flexible printed circuit board used for an embodiment of the present invention.
Figure 12:
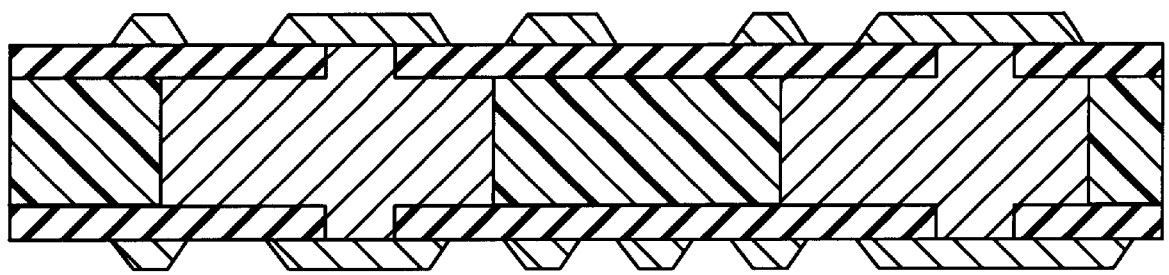
FIG. 12 is a cross-sectional view of a double-sided circuit board according to an embodiment of the present invention using the flexible printed circuit board.

Next, flexible-printed-circuit method as another manufacturing method according to the present invention will be described. FIG. 11 shows a flexible printed circuit board comprising an insulating layer 1001 and a wiring 1002. The insulating layer 1001 comprises a film, and a polyimide film is most frequently used therefor. The wiring 1002 comprises a copper foil patterned by photoetching. A hole 1003 is to serve as the second via hole. This hole is easily formed by using an excimer laser. The circuit board of this structure has been well known as a TAB tape aside from the size of the holes. FIG. 12 shows a cross-sectional view of a double-sided printed circuit board according to this embodiment using the flexible printed circuit board.

Figure 13A:
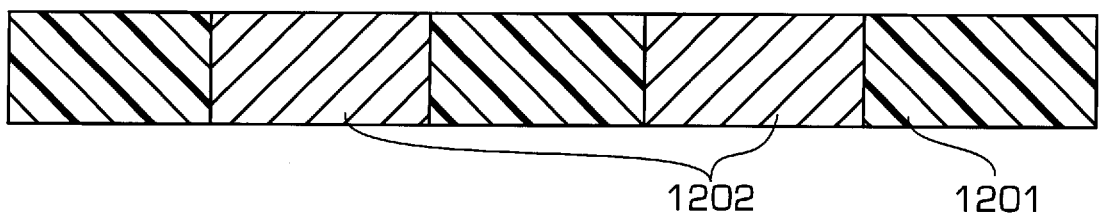
FIG. 13 shows an example of a built-up process according to an embodiment of the present invention.
Figure 13B:
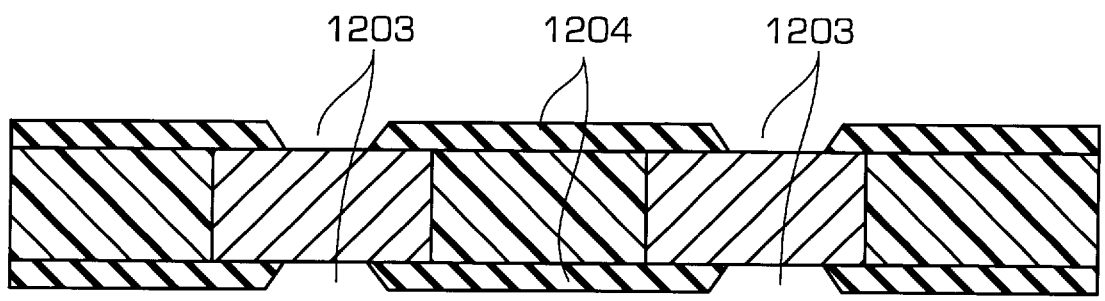
Figure 13C:
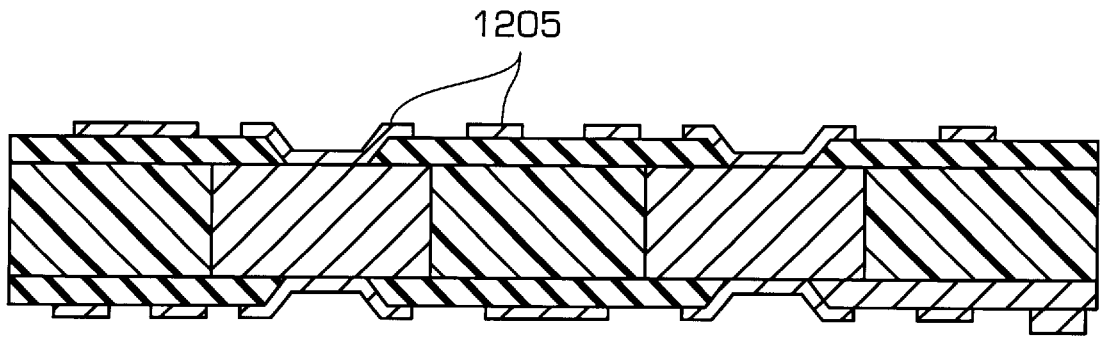

Next, FIG. 13 shows a built-up process as a manufacturing method according to the present invention in which layers are successively laminated on a base material. In this process, a base material 1201 having already been hardened is used which has a first via hole 1202 having already been hardened. An insulating layer 1204 having a second via hole 1203 is formed on each of the upper and lower surfaces of the base material 1201 and a wiring 1205 is formed by plating or another conductive film forming method. In this structure, the conductive material with which the second via hole is filled is different from that with which the first via hole is filled.

Figure 14:
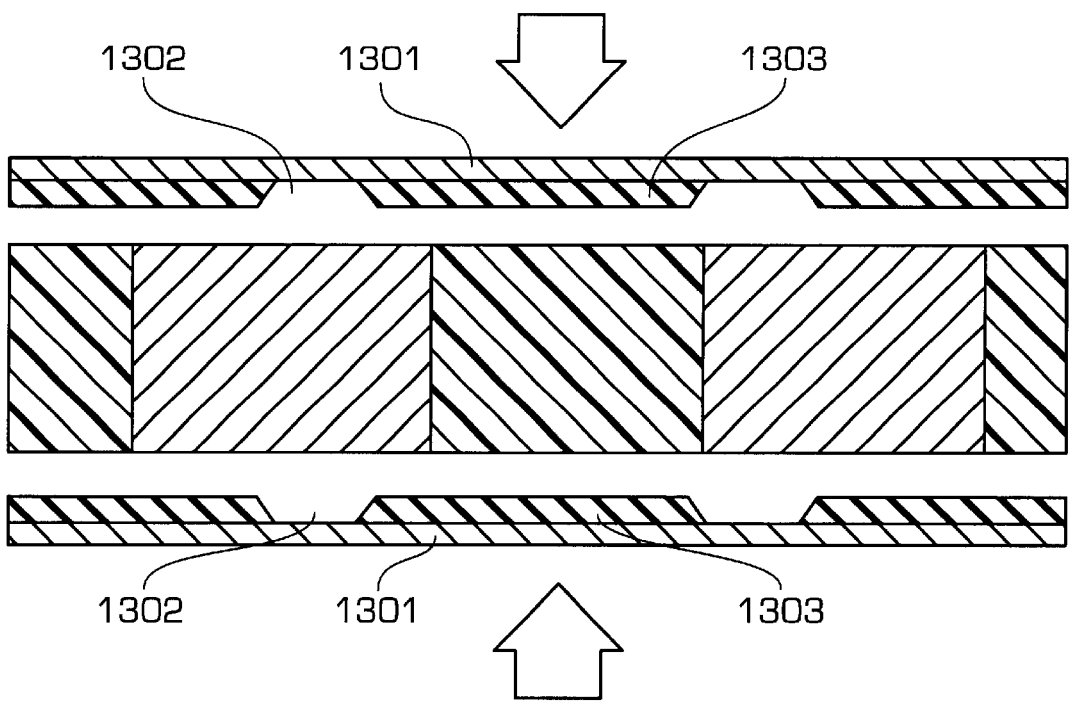
FIG. 14 shows a copper foil having an insulating layer, used in an embodiment of the present invention.
Figure 15A:
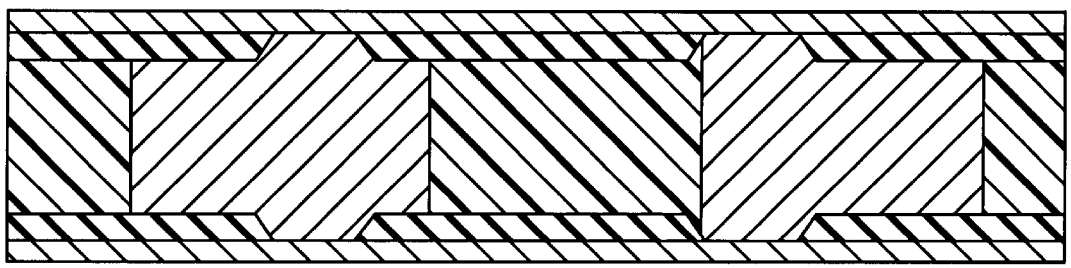
FIG. 15 shows a process using the copper foil of FIG. 14.
Figure 15B:
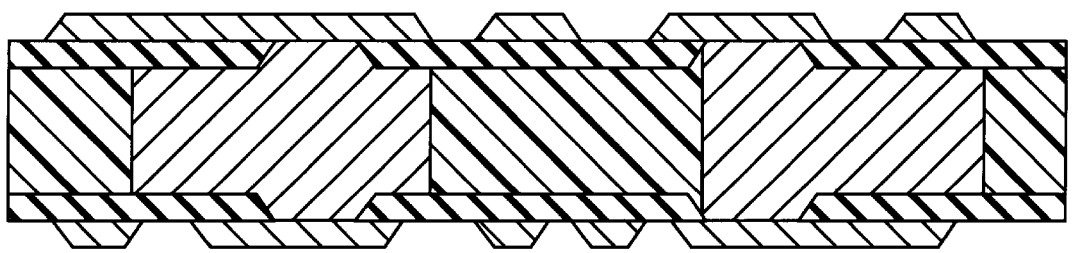

The processes shown in FIGS. 14 and 15 resemble the flexible-printed-circuit method but the order of manufacturing steps is different. As shown in FIG. 14, upper and lower insulating layers 1303 each having a hole 1302 which is to serve as the second via hole are prepared on copper foils 1301 and an unhardened base material in which a hole that is to serve as the first via hole is filled with an unhardened conductive paste is interposed therebetween. The lamination is pressurized and heated to harden the base material and the conductive paste for integration (FIG. 15A). Then, the copper foils on the surfaces are patterned by etching to obtain a double-sided circuit board (FIG. 15B).

Figure 16A:
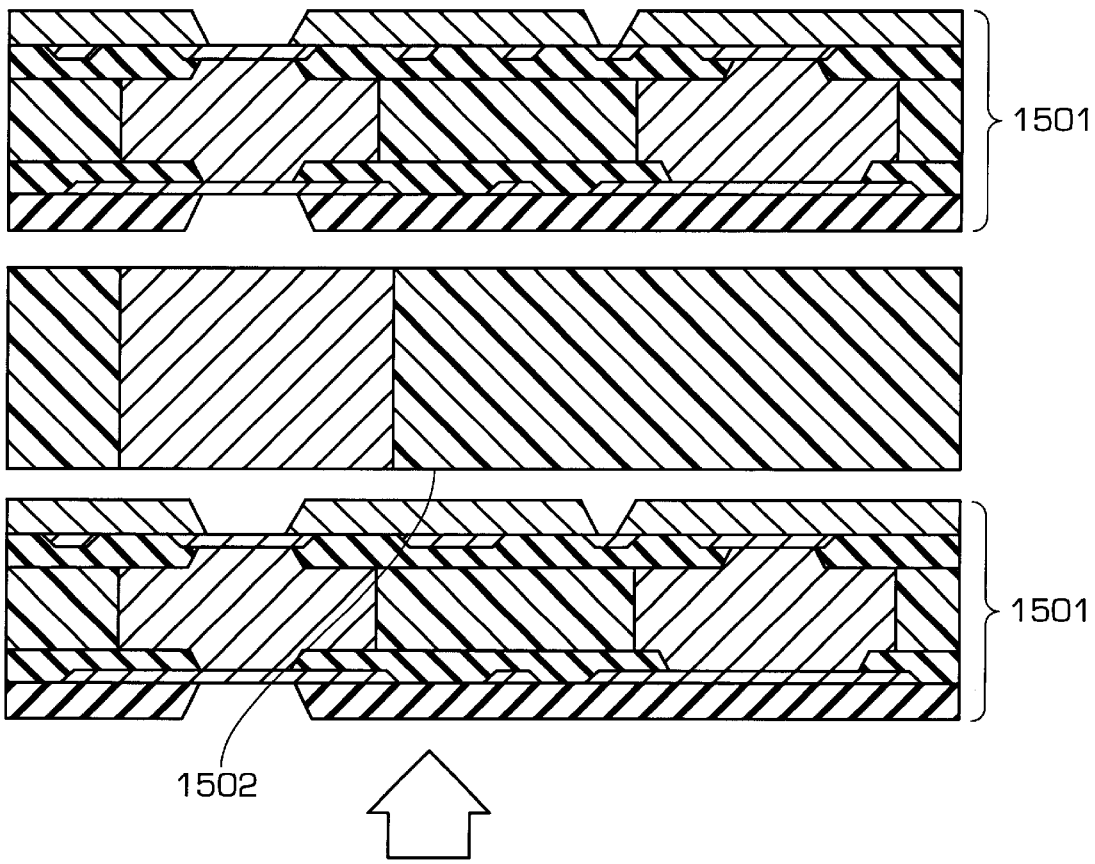
FIG. 16 shows an example of a method for manufacturing a multilayer printed circuit board according to an embodiment of the present invention.
Figure 16B:
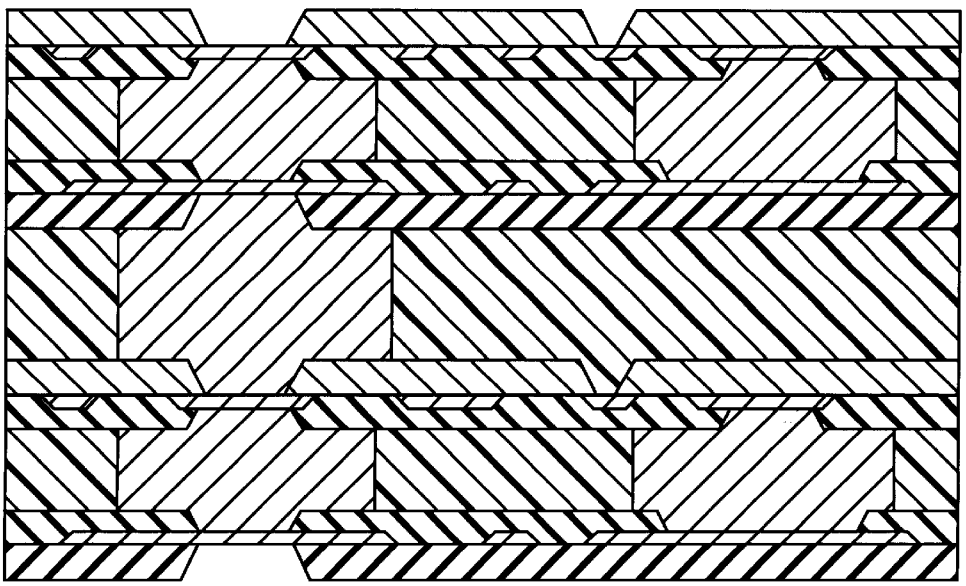

FIG. 16 shows a method for manufacturing a multilayer printed circuit board. Two double-sided printed circuit boards 1501 as described with reference to FIG. 2 are prepared and an unhardened base material 1502 in which a hole that is to serve as the first via hole is filled with a conductive paste is sandwiched therebetween. The lamination is pressurized and heated in a vacuum (FIG. 16A) so that the conductive paste and the base material are hardened for integration (FIG. 16B). Thus, a four-layer printed circuit board is manufactured. It is easy to manufacture a printed circuit board comprising more layers and the printed circuit board is doubled-sided. By laminating one more layer of the double-sided printed circuit board on each surface, a six-layer printed circuit board is realized and by laminating two four-layer printed circuit boards, an eight-layer printed circuit board is realized.

Figure 17:
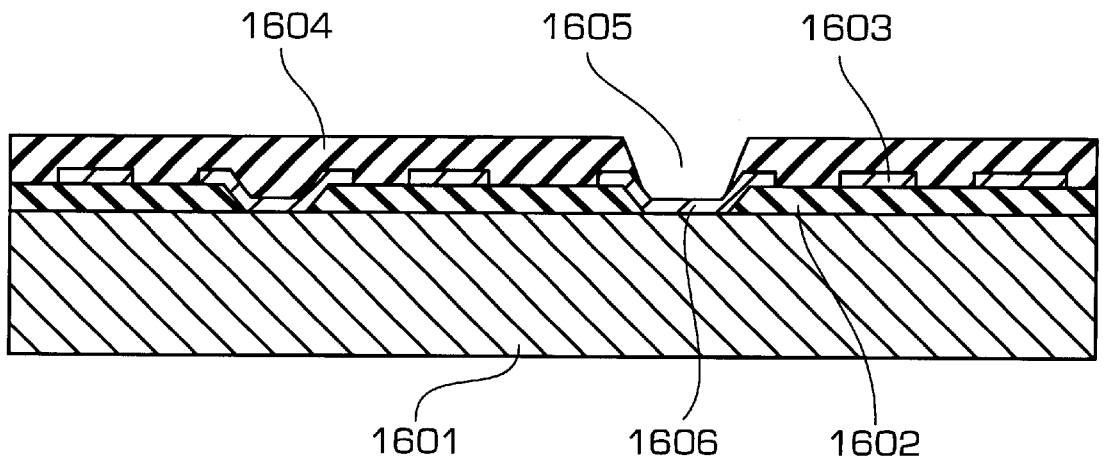
FIG. 17 shows a transfer medium according to an embodiment of the present invention.
Figure 18:
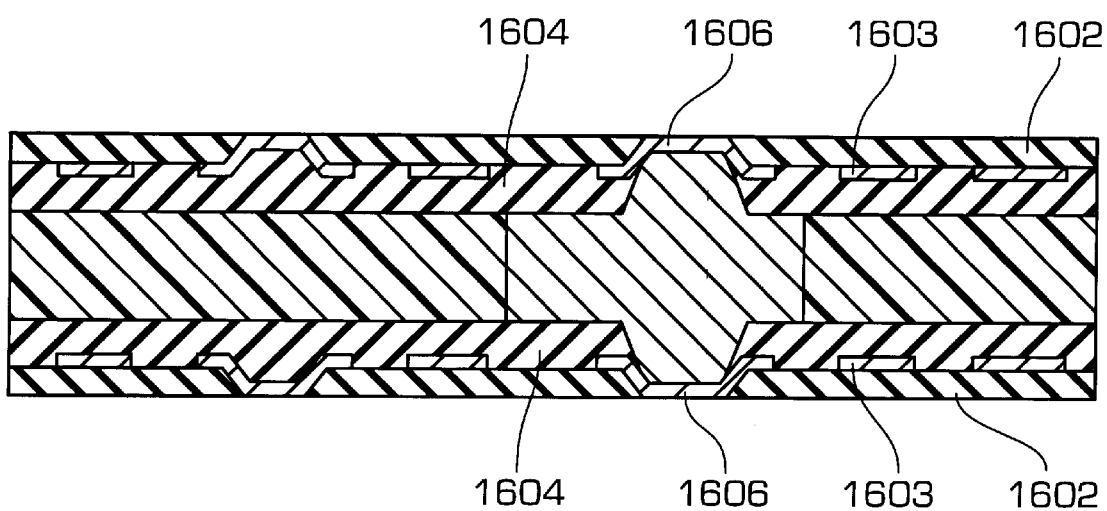
FIG. 18 shows a double-sided printed circuit board manufactured by preparing two of the transfer media shown in FIG. 17.

The transfer medium shown in FIG. 17 is a transfer medium effective for manufacturing a double-sided printed circuit board according to another mode. A mold release treatment is applied to a surface of a supporter 1601 and an insulating layer 1602 is formed on the surface. Then, a necessary hole 1606 is formed and a wiring 1603 comprising a conductive film is laminated. Then, a hole 1605 which is to serve as the second via hole is formed. The transfer medium is thus formed. By preparing two such transfer media and manufacturing a double-sided printed circuit board in a manner similar to that described with reference to FIG. 7, one as shown in FIG. 18 is realized. The surfaces of the double-sided circuit board are flat.

Figure 5:
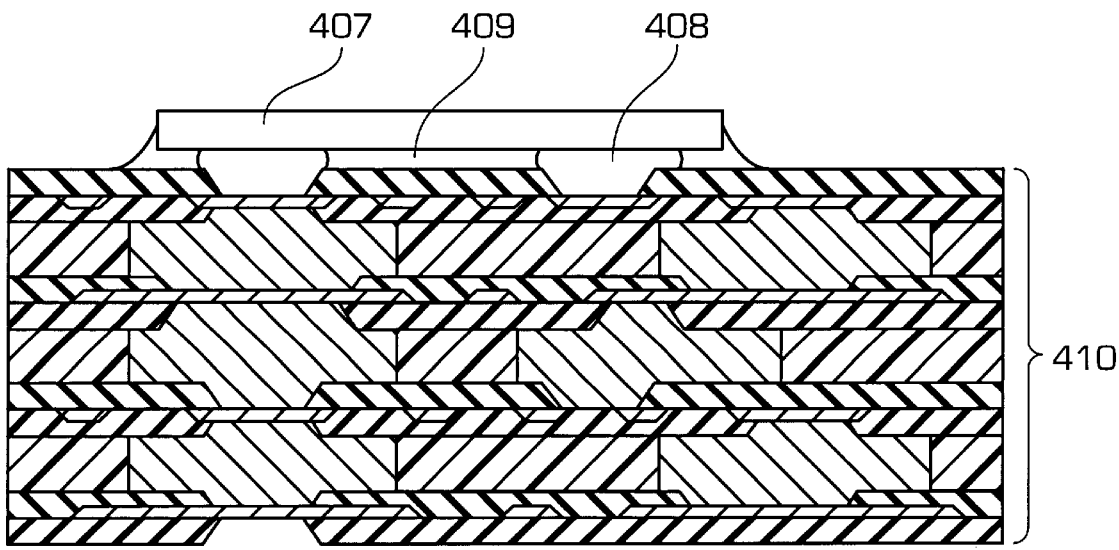
FIG. 5 shows a circuit component mount unit using a circuit board of an embodiment of the present invention manufactured by a transfer process.

FIG. 5 shows a circuit component mount unit using a circuit board according to the present invention manufactured by the transfer process. Reference numeral 407 represents a bare chip. Reference numeral 408 represents a bump. Reference numeral 409 represents an under fill. Reference numeral 410 represents the multilayer printed circuit board of FIG. 4. The circuit component mounted unit is inexpensive although being high in density and small in size because the surfaces of the printed circuit board are flat, and then there are no solder bridges and the yield is excellent. In particular, a circuit component mounted unit in which a bare LSI is flip-chip-bonded onto a printed circuit board according to the present invention is small in size, high in speed and inexpensive.

Figure 19:
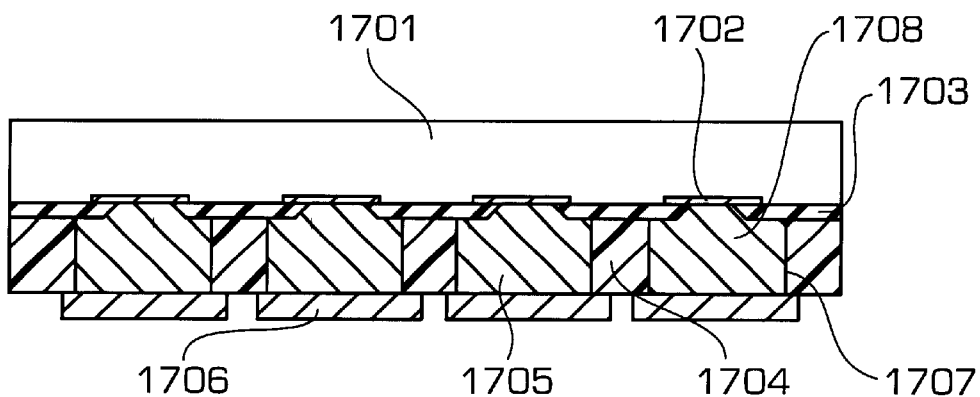
FIG. 19 shows an example of a small-size package such as a semiconductor chip according to an embodiment of the present invention.

FIG. 19 is a cross-sectional view of a package of electronic components such as semiconductor chips according to another embodiment of the present invention. The following are laminated from the top to the bottom: a base material layer 1704 having a copper foil pad 1706 on its one surface and having a first via hole 1707; an insulating layer 1703 having a second via hole 1708 and provided on the other surface of the base material layer 1704; and a semiconductor chip 1701 having an electrode 1702 so as to correspond to the position of the second via hole 1708. The cross-sectional area of the second via hole 1708 is smaller than that of the first via hole 1707. The first and second via holes are filled with a conductive material 1705. Conductive material 1705 can include an abrasive. An input and output pad (electrode) 1702 is typically an aluminum electrode in the case of the semiconductor chip. The base material layer 1704 is made of an insulative resin. The insulating-cum-protective film 1703 is an insulating-com-protective film on the semiconductor chip and is typically made of silicon nitride. Recently, a silicon nitride film coated with polyimide has been frequently used.

As the insulative resin for the base material layer, many resins are known now. Epoxy resin is widely used in this field. Some resins are provided with photosensitivity for the formation of the holes. The range of choice of resin has been extended because the laser can now be used for forming the holes. As the resin used for electronic components, one which is low in moisture absorbency is desired. Such resins have been developed in multiplicity. Moreover, as the resin which is in contact with the semiconductor, one which is low in impurity content is preferred. Although the thermal expansion coefficient is preferably close to that of silicon, since there is no simple material that has such a thermal expansion coefficient, a filler is frequently mixed.

For excellent electrical connection between the aluminum electrode and the conductive material, it is necessary to remove an oxide film on the surface of the aluminum electrode. Before the conductive paste is brought into contact with the aluminum electrode, the oxide film on the aluminum surface is removed by reverse sputtering or reduction treatment.

The package of FIG. 19 has the same size as the semiconductor chip, and is low in cost because it is small in size and easily manufactured.

Figure 20:
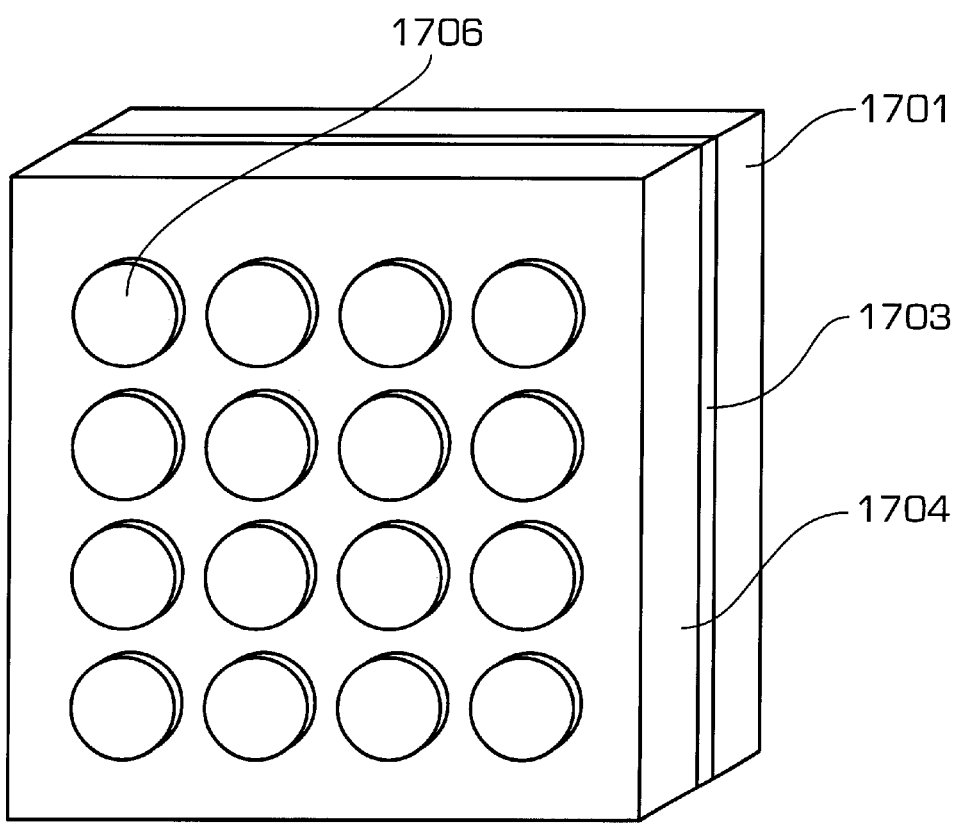
FIG. 20 is a perspective view of the package of FIG. 19.
Figure 21:
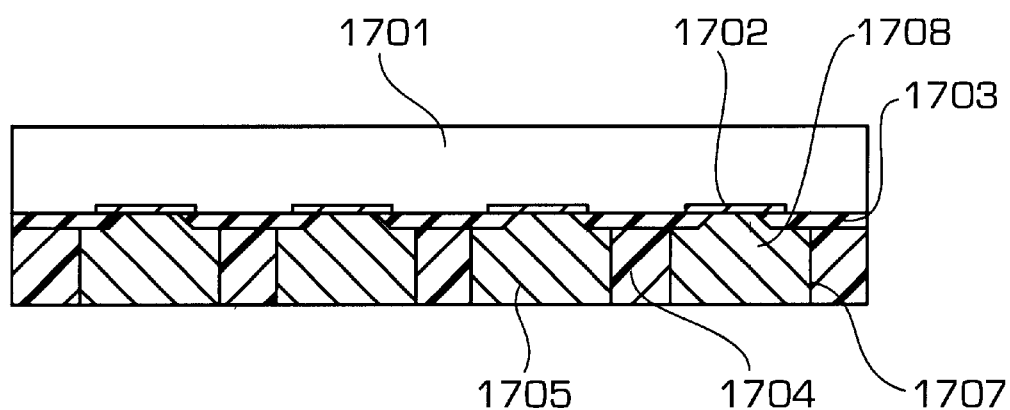
FIG. 21 shows another example of a small-size package such as a semiconductor chip according to an embodiment of the present invention.

FIG. 21 shows another example of the package. When the conductive paste 1705 is of a solderable type, the package may be treated as a package mountable on a printed circuit board under the condition of FIG. 21. FIG. 20 is a perspective view of the printed circuit board of FIG. 19 viewed from the bottom surface side.

As the solderable conductive paste 1705, a conductive paste is preferred which comprises copper powder, resin and a hardener. The content of the copper powder is preferably 85 weight % or higher. A conductive paste is commercially available which is solderable without any treatment applied thereto after hardening. Even when normal copper paste is used, soldering is enabled by mechanically or chemically removing the resin on the surface after hardening. As a simple method therefor, soldering is enabled by mechanically grinding the surface.

The present invention does not stick to soldering. Recently, an attempt has frequently been made to bond electronic components to a printed circuit board with a conductive paste without the use of solder in order to prevent lead pollution. This package conforms to this tendency.

Simple methods for manufacturing a package of the structure of FIG. 19 or FIG. 21 include a method in which a through hole is formed in an insulative resin sheet in a position corresponding to the position of the electrode of an electronic component, a conductive paste is embedded in the hole and pressurized and heated so that the conductive paste is hardened to bond the electronic component.

At this time, by using as the insulative resin sheet a prepreg with aramid nonwoven cloth as a reinforcing material, the conductive paste is compressed at the time of heating and pressurizing because of its compressibility, so that the conductivity increases after the paste is hardened. Needless to say, a simple resin may be used as the insulative resin sheet. Since the resin flows at the time of heating and pressurizing, similar effects to those of a compressive insulative resin sheet are obtained. The pressurizing process is important. Moreover, since the oxide film on the aluminum electrode can be broken by the pressurizing process, the oxide film removing process to be performed in advance may be omitted. In order to positively use this effect, it is also preferred to mix abrasive particle in the conductive paste.

It should be understood that the package of this structure may be processed not in chips but in wafers. A pretreatment is performed before the wafer is divided into chips and the wafer is divided later. Consequently, the cost of the package is greatly reduced. It is apparent that the method for manufacturing the structure of the present invention is not limited to the above-described manufacturing methods. There are many other available manufacturing methods. An example is a method in which a semiconductor wafer is coated with an insulative resin, the insulative resin is hardened by heating, a through hole is formed in the insulative resin with an excimer laser so that an aluminum electrode is exposed, the hole is filled with a conductive paste, the conductive paste is heated and pressurized and the surface is ground.

As is apparent from the above-described embodiments, the present invention provides a circuit board comprising a base material layer having a first via hole and an insulating layer having a second via hole and provided on at least one surface of the base material layer, and being inexpensive because a fine interconnecting pattern may be formed and the work size may be large although the first via hole is large since the cross-sectional area of the second via hole is smaller than that of the first via hole. In addition, a package is obtained which is inexpensive because treatments may be performed in wafers.

What is claimed is:

1. A resin printed circuit board comprising:
   a base material layer made of an insulative resin and having a first via hole; and
   an insulting layer having a second via hole, said insulating layer being provided on at least one surface of said base material layer,
   wherein said first and second via holes are filled with a conductive material, wherein a cross-sectional area of said second via hole is smaller than a cross-sectional area of said first via hole, and wherein said second via hole has inclining interior walls that define the cross-sectional area of said second via hole at a surface of said insulating layer to be smaller than the cross-sectional area of said second via hole at an internal portion of said insulating layer, said internal portion of said insulating layer being nearer to said base material layer than said surface of said insulating layer.

2. A printed circuit board according to claim 1, wherein said conductive material is a conductive paste.

3. A printed circuit board according to claim 2, wherein said conductive material with which said first via hole is filled and said conductive material with which said second via hole is filled are the same.

4. A printed circuit board according to claim 2, wherein said conductive material with which said first via hole is filled and said conductive material with which said second via hole is filled are different.

5. A printed circuit board according to claim 1, wherein said insulating layer is provided on both surfaces of said base material layer.

6. A printed circuit board according to claim 1, wherein a wiring portion is provided outside said insulating layer.

7. A printed circuit board according to claim 1, wherein a wiring portion is provided inside said insulating layer.

8. A printed circuit board according to claim 7, wherein said insulating layer comprises a plurality of layers.

9. A multilayer printed circuit board wherein a plurality of said printed circuit boards according to claim 1 are laminated.

10. A circuit component mount unit wherein a circuit component is mounted to said multilayer printed circuit board according to claim 9, said circuit component being connected to a wiring portion of an outermost layer of said multilayer printed circuit board.

11. A circuit component mount unit according to claim 10, wherein said circuit component includes a base integrated circuit.

12. A circuit component mount unit wherein a circuit component is mounted to said printed circuit board according to claim 1, said circuit component being connected to a wiring portion of an outermost layer of said printed circuit board.

13. A circuit component mount unit according to claim 12, wherein said circuit component includes a bare integrated circuit.

14. A printed circuit board according to claim 1, wherein said insulative resin is one of an aramid epoxy prepreg, an insulative film coated with an adhesive, and a sheet-form unhardened adhesive.

15. An electronic component package comprising:
    a base material layer made of an insulative resin and having a first via hole, said base material having a copper foil pad attached to one surface;
    an insulating layer having a second via hole, said insulating layer being provided on another surface of said base material; and
    an electronic component having an electrode so as to correspond to a position of said second via hole, wherein a cross-sectional area of said second via hole is smaller than a cross-sectional area of said first via hole, wherein said first and second via holes are filled with a conductive material, and wherein said second via hole has inclining interior walls that define the cross-sectional area of said second via hole at a surface of said insulating layer to be smaller than the cross-sectional area of said second via hole at an internal portion of said insulating layer, said internal portion of said insulating layer being nearer to said base material layer than said surface of said insulating layer.

16. An electronic component package according to claim 15, wherein said conductive material is a copper paste.

17. An electronic component package according to claim 15, wherein said conductive material includes an abrasive.

18. An electronic component package according to claim 15, wherein said insulating layer and said conductive material have flexibility.

19. An electronic component package according to claim 15, wherein said electrode of said electronic component is an aluminum electrode.

20. An electronic component package comprising:
    a base material layer made of an insulative resin and having a first via hole;
    an insulating layer having a second via hole, said insulating layer being provided on a surface of said base material; and
    an electronic component having an electrode so as to correspond to a position of said second via hole, wherein said second via hole has inclining interior walls that define the cross-sectional area of said second via hole at a surface of said insulating layer to be smaller than the cross-sectional area of said second via hole at an internal portion of said insulating layer, said internal portion of said insulating layer being nearer to said base material layer than said surface of said insulating layer, wherein said first and second via holes are filled with a conductive material, and wherein said conductive material with which said first via hole is filled is solderable.

21. A printed circuit board comprising:
    a base material layer having a first via hole; and
    an insulting layer having a second via hole, said insulating layer being provided on at least one surface of said base material layer,
    wherein said first and second via holes each are filled with a conductive material, wherein said conductive mate rial filling first via hole is different from said conductive material filling said second via hole, wherein a cross-sectional area of said second via hole is smaller than a cross-sectional area of said first via hole, and wherein a part of said conductive material from said second via hole also is embedded in said first via hole.

22. A printed circuit board according to claims 1 and 21 further comprising a via pad over said second via hole, said via pad having a cross-sectional area smaller than said cross-sectional area of said first via hole.

* * * * *